United States Patent
Wei et al.

(10) Patent No.: US 8,441,295 B2
(45) Date of Patent: May 14, 2013

(54) DELAY GENERATOR

(75) Inventors: He-Gong Wei, Macau (CN); U-Fat Chio, Macau (CN); Sai-Weng Sin, Macau (CN); Seng-Pan U, Macau (CN); Rui Paulo da Silva Martins, Macau (CN)

(73) Assignee: University of Macau, Macau (CN)

( * ) Notice: Subject to any disclaimer, the term of this patent is extended or adjusted under 35 U.S.C. 154(b) by 32 days.

(21) Appl. No.: 13/289,229

(22) Filed: Nov. 4, 2011

(65) Prior Publication Data

US 2012/0286840 A1     Nov. 15, 2012

(30) Foreign Application Priority Data

May 9, 2011 (TW) .............................. 100116148 A

(51) Int. Cl.
*H03H 11/06*     (2006.01)

(52) U.S. Cl.
USPC ............ 327/276; 327/278; 327/284; 327/285

(58) Field of Classification Search ..................... 327/94, 327/276–278, 284–285, 291, 297–299
See application file for complete search history.

(56) References Cited

U.S. PATENT DOCUMENTS 5,917,440 A * 6/1999 Khoury .......................... 341/143
6,839,011 B1 * 1/2005 Hong ............................. 341/143
8,004,337 B2 * 8/2011 Brannen ........................ 327/264

OTHER PUBLICATIONS

He-Gong Wei, U-Fat Chio, Sai-Weng Sin, Seng-Pan U, Rui Paulo da Silva Martins, "A Process-insensitive Current-Controlled Delay Generator with Threshold Voltage Compensation," in Proc. of IEEE Asian Solid-State Circuits Conference—ASSCC 2010, pp. 1-4, Beijing, China, Nov. 2010.

* cited by examiner

*Primary Examiner* — An Luu
(74) *Attorney, Agent, or Firm* — Bacon & Thomas, PLLC

(57) ABSTRACT

A delay generator comprises: a current source for supplying a current; a first delay portion, connected to the current source, comprising at least a plurality of inverters and a first capacitor having a first capacitance; and a second delay portion, connected to the current source, comprising at least a plurality of inverters and a second capacitor having a second capacitance, wherein the first capacitance is the same as the second capacitance, wherein the first delay portion generates a first delay by discharging of the first capacitor, wherein the second delay portion generates a second delay by charging of the second capacitor, and wherein the total delay generated by the delay generator is obtained by summation of the first delay and the second delay.

4 Claims, 5 Drawing Sheets

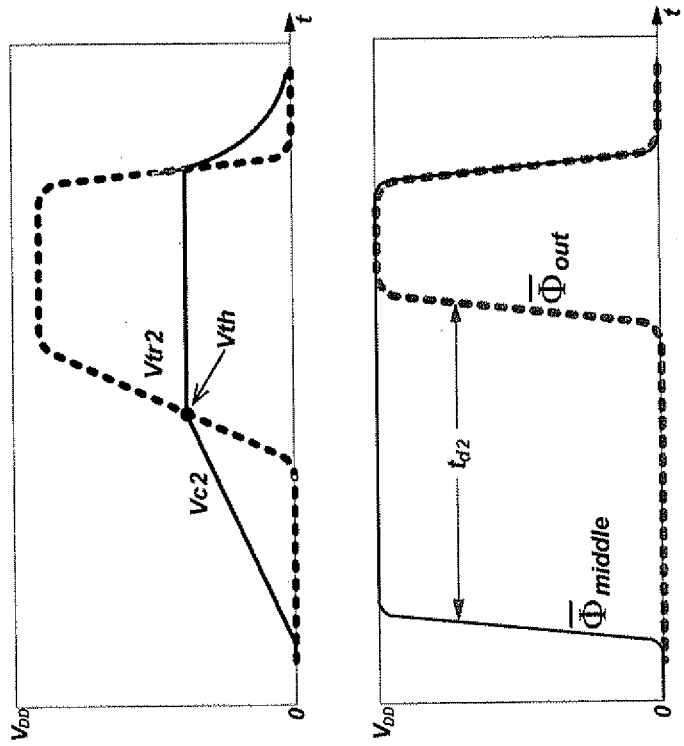
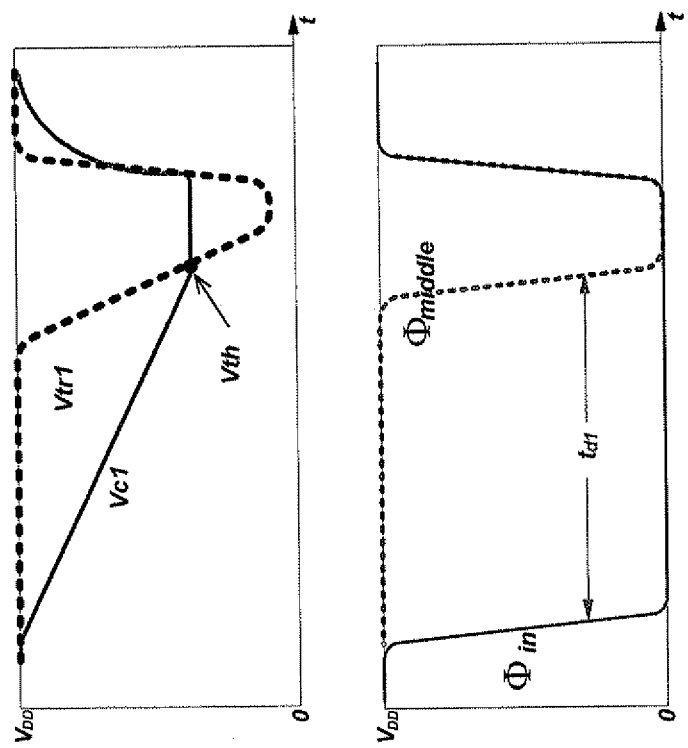
Fig. 5a
Fig. 5b

DELAY GENERATOR

BACKGROUND OF THE INVENTION

The present invention relates to a delay generator. More particularly, it relates to a process-insensitive current-controlled delay generator with threshold voltage compensation.

DESCRIPTION OF THE RELATED ART

Sampled-data systems incorporating data conversion and switched-capacitor filters are indispensable in state-of-art IC design, and are crucial for applications such as telecommunication, consumer electronics and medical imaging. In such discrete-time systems, the clock generator is extremely important, and the accuracy of the clock signal is determinant in the overall design since it often affects the overall resolution. However, the variation of the clock pulse width exists inevitably and is normally associated with process or temperature variations in the delay paths. Usually, large design margins should be adopted in the transistor implementation to overcome such process variations. Unfortunately, this would imply extra power consumption with the subsequent degradation of system performance.

Therefore, process-insensitive delay generators are highly demanded and effective solutions have been proposed either off-chip or on-chip.

Traditionally, the delay generator is implemented by the inverter-chain, also referred to as $g_m/C$ circuit that accumulates the time delay of the inverters and provides the time delay for the system. Although its architecture is quite simple, it suffers from a significant process variation sensitivity that can lead to a significant ±15% variation in time delay.

An alternative solution, the current-controlled delay generator was previously proposed to achieve higher process-insensitivity with the utilization of less process-sensitive circuit elements. FIG. 1a schematically illustrates a simplified delay generator which contains basically a current source, a capacitor, switches, and output buffers; and FIG. 1b illustrates input and output waveforms of the delay generator of FIG. 1a. The top-plate of the capacitor C is firstly charged to the voltage supply VDD and $\Phi_{out}$ remains at HIGH level. Then, the capacitor C is linearly discharged by a constant current $I_b$ which is controlled by the current source, and thus a delay $t_d$ is generated.

To calculate the delay $t_d$, firstly refer to the following equation:

$$i = C\frac{dV_C}{dt} \quad (1)$$

Under a linear situation, $dt \approx \Delta t$ and $dV_C \approx \Delta V_C$, thus when $i=I_b$; we obtain $$\Delta t = C\frac{\Delta V_C}{I_b} = t_d \quad (2)$$

where $\Delta V_C$ is equal to $VDD-V_{th}$ ($V_{th}$ is the threshold voltage of the inverter connected to Vc).

The current $I_b$ is provided by the current source and its accuracy is mainly related to the precision of the current mirror and the reference current. This is usually accurate and the current mirror is relatively easy to design with good matching. Therefore, the current will not be significantly affected by process variations. Besides, a MOS-capacitor is adopted to ensure less sensitivity to process variations, when compared with other type of implementations of the capacitors. Normally, the MOS-capacitance varies around ±5% with process.

However, the delay generator of FIG. 1a is still sensitive to process variations, mainly because of threshold voltage variation of the inverter connected to the capacitor. When $V_C$ decreases, the inverter will be triggered to generate the delay $t_d$ until $V_C$ passes its threshold voltage $V_{th}$ that depends on the robustness of the N/PMOS transistors and is highly process-sensitive.

SUMMARY OF INVENTION

In view of the above, it is an object of the present invention to provide an advanced current-controlled delay generator using process-insensitive components such as current mirrors and MOS-capacitors, thereby avoiding the complexity of a delay-locked loop (DLL). By applying the threshold voltage compensation, the delay generator of the present invention reduces the deviation induced by the internal inverter buffer, and thus becomes more robust to process variations than prior art.

According to an aspect of the present invention, a delay generator comprises: a current source for supplying a current; a first delay portion, connected to the current source, comprising at least a plurality of inverters and a first capacitor having a first capacitance; and a second delay portion, connected to the current source, comprising at least a plurality of inverters and a second capacitor having a second capacitance, wherein the first capacitance is the same as the second capacitance, wherein the first delay portion generates a first delay by discharging of the first capacitor, wherein the second delay portion generates a second delay by charging of the second capacitor, and wherein the total delay generated by the delay generator is obtained by summation of the first delay and the second delay.

According to the above aspect of the present invention, the total delay is determined by the current and the first capacitance.

According to the above aspect of the present invention, the first delay portion further comprises two switches that will be turned on by opposite input clocks.

According to the above aspect of the present invention, the second delay portion further comprises two switches that will be turned on by opposite input clocks.

BRIEF DESCRIPTION OF THE DRAWINGS

These and other objects, features and advantages of the present invention will become more apparent from the following description when taken in conjunction with the accompanying drawings.

FIG. 1b illustrates input and output waveforms of the delay generator of FIG. 1a.

FIG. 5a shows the characteristic waveforms for a first delay portion of the delay generator according to the present invention.

FIG. 5b shows the characteristic waveforms for a second delay portion of the delay generator according to the present invention.

DETAILED DESCRIPTION OF THE PREFERRED EMBODIMENT

A preferred embodiment for a delay generator according to the invention is described with reference to the drawings as follows.

Figure 1A:
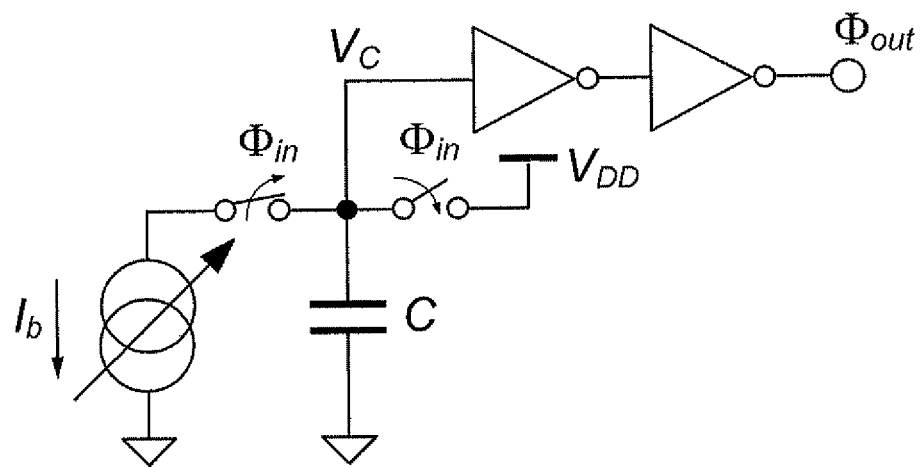
FIG. 1a shows a simplified diagram of a delay generator according to prior art.
Figure 1B:
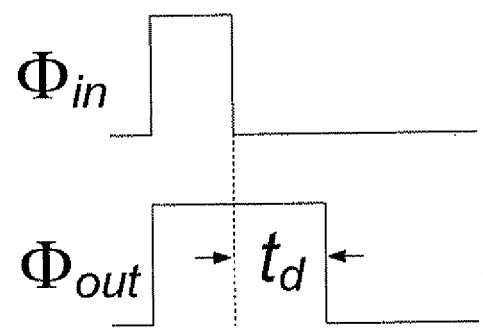
Figure 2:
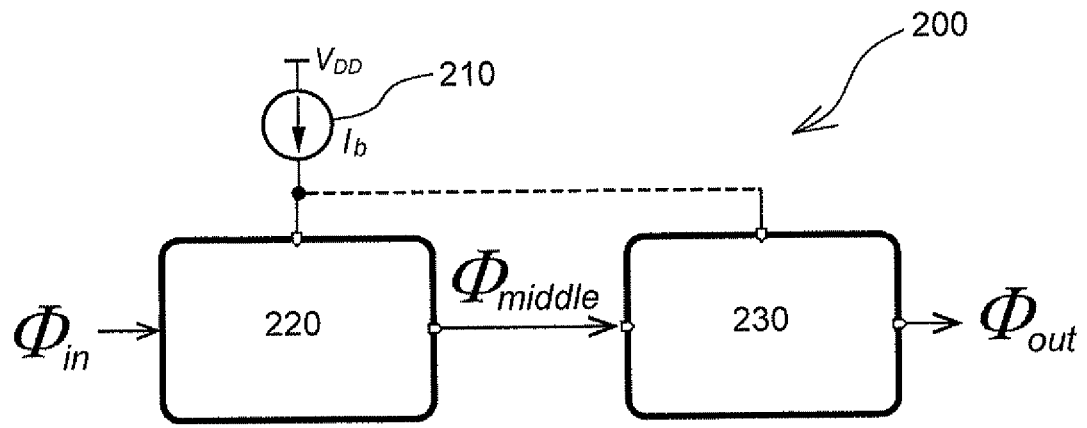
FIG. 2 shows a block diagram of a delay generator according to the present invention.
Figure 3:
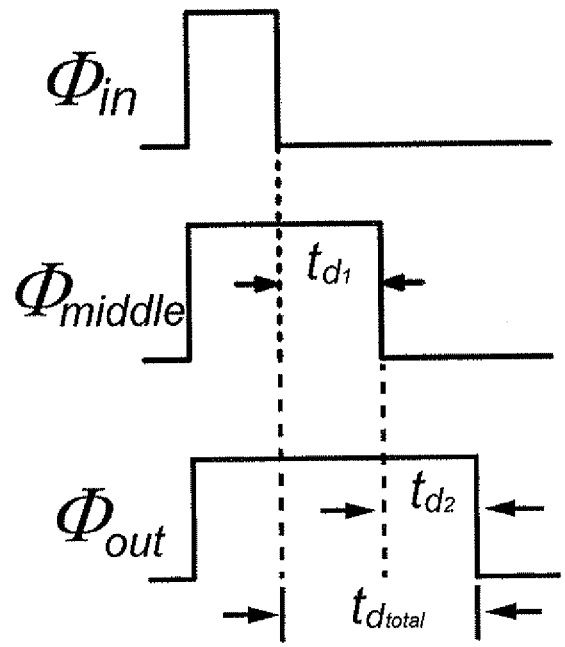
FIG. 3 illustrates input and output waveforms of the delay generator according to the present invention.

Refer firstly to FIG. 2, which illustrates an embodiment of a current-controlled delay generator 200 according to the invention. In this embodiment, the delay generator 200 comprises a current source 210, a first delay portion 220 and a second delay portion 230. The current source 210 provides a current $I_b$ to both the first delay portion 220 and the second delay portion 230. An input clock $\Phi_{in}$ in is fed into the first delay portion 220 and an output clock $\Phi_{middle}$ having a delay $t_{d1}$ with respect to the clock $\Phi_{in}$ is generated. Next, the clock $\Phi_{middle}$ is fed into the second delay portion 230 and an output clock $\Phi_{out}$ having a delay $t_{d2}$ with respect to the clock $\Phi_{middle}$ is generated. As a result, the total delay $t_{dtotal}$ generated by the delay generator 200 is obtained as $t_{d1}+t_{d2}$. A schematic diagram showing the total delay $t_{dtotal}=t_{d1}+t_{d2}$ is shown in FIG. 3. The total delay $t_{dtotal}$ generated by the delay generator 200 is insensitive to the process variation because the process variation incurred when $t_{d1}$ is generated and the process variation incurred when $t_{d2}$ is generated will be compensated by each other. A further detail for achieving the compensation effect of the process variation according to the present invention is described as follows.

Figure 4:
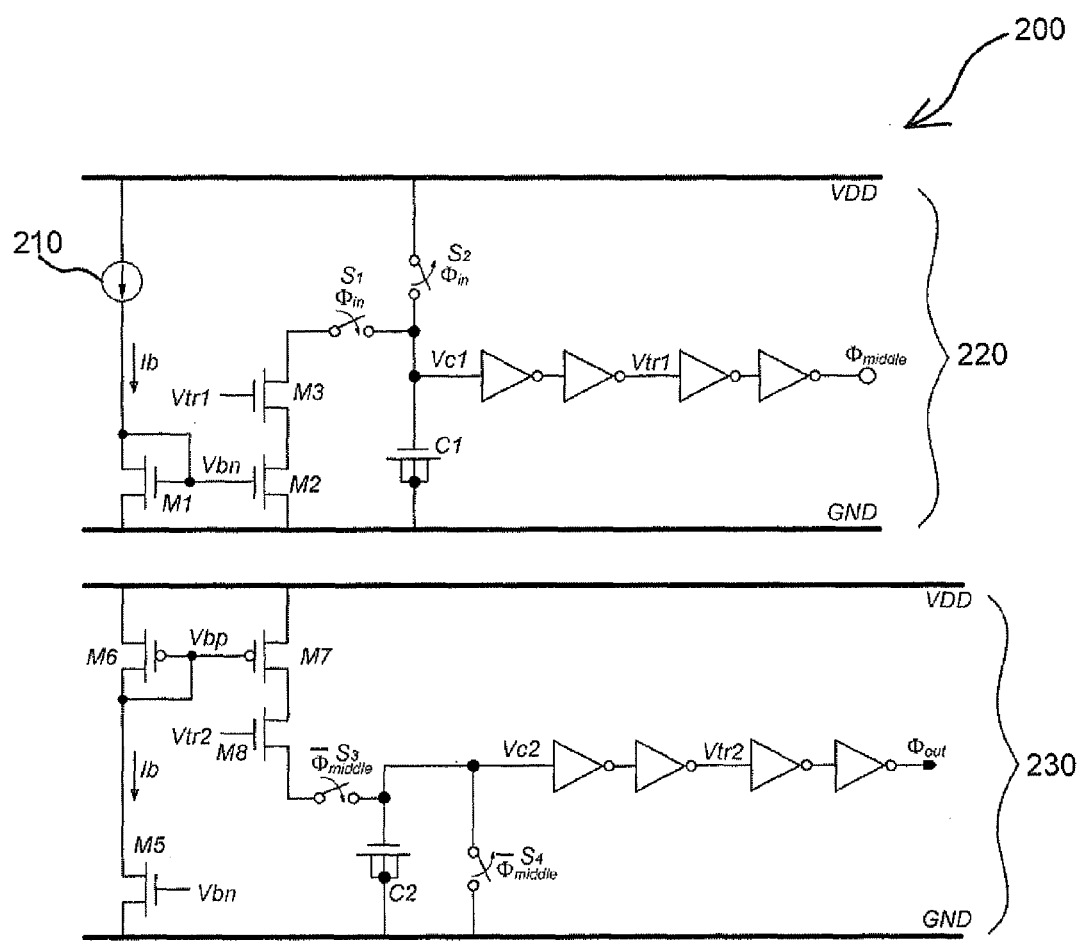
FIG. 4 shows the circuit implementation of the delay generator according to the present invention.

The circuit of FIG. 4 represents a preferred embodiment of the delay generator 200. As shown in the figure, the delay generator 200 is comprised of the first delay portion 220 and the second delay portion 230. Although, in FIG. 4, the current source 210 is shown as included in the first delay portion 220, the current $I_b$ is also provided to the second delay portion 230 through the bias point Vbn.

The operation of the first delay portion 220 can be divided into two phases. At the first phase, the clock $\Phi_{in}$ is going from LOW to HIGH, the switch S1 is open (turned off) and the switch S2 is closed (turned on). Accordingly, a transient current will charge a capacitor C1 until the top-plate voltage $V_{C1}$ of the capacitor C1 reaches VDD. Next, at the second phase, the clock $\Phi_{in}$ is going from HIGH to LOW, the switch S1 is closed (turned on) and the switch S2 is open (turned off). Because $V_{C1}$ has been charged to VDD, the voltage $V_{tr1}$ (which is obtained from $V_{C1}$ after two inverters) will be VDD, too. Thus, M3 connects and a discharging current begins to flow. The current mirror comprised of M1 and M2 renders the discharging current equal to $I_b$. The charge stored on the top plate of the capacitor C1 flows to the ground through S1, M3 and M2, and thus the voltage $V_{C1}$ starts dropping. When $V_{C1}$ reaches the threshold voltage $V_{th}$ (triggering point) of the inverter, $V_{tr1}$ becomes digital '0' and thus shuts off M3. At this moment, the discharging current stops flowing from C1 and $V_{C1}$ remains the same. The above discharging operation generates a delay $t_{d1}$, and thus the clack $\Phi_{middle}$ is output, as clearly illustrated in FIG. 5a. Subsequently, the operation returns to the first phase, $V_{C1}$ will be charged to VDD again and $V_{tr}$ also goes to VDD by rapid pull-up of the inverter.

As shown in FIG. 5a, $V_{C1}$ is dropping linearly. Accordingly, by referring to the above-mentioned equation (2), $t_{d1}$ can be expressed as:

$$t_{d1} = C1 \frac{V_{th} - VDD}{-I_b} \quad (3)$$

Similarly, the operation of the second delay portion 230 can be divided into two phases. For the second delay portion 230, the clock $\Phi_{middle}$ is inverted and used as an input clock. At the first phase, the clock $\overline{\Phi}_{middle}$ is going from HIGH to LOW, the switch S3 is open (turned off) and the switch S4 is closed (turned on). Accordingly, C2, which has a capacitance as the same as that of C1, will be discharged through the switch S4 and reset to ground. Next, at the second phase, the clock $\overline{\Phi}_{middle}$ is going from LOW to HIGH, the switch S3 is closed (turned on) and the switch S4 is open (turned off). Accordingly, C2 is charged by a constant current from a p-type current mirror comprised of M6 and M7, and the voltage $V_{C2}$ starts raising from 0 (ground). When $V_{C2}$ reaches the threshold voltage $V_{th}$ (triggering point) of the inverter, $V_{tr2}$ becomes digital '0' and thus shuts off M8. At this moment, the charging current stops flowing to C2 and $V_{C2}$ remains the same. The above charging operation generates a delay $t_{d2}$, and thus the clock $\Phi_{out}$ is output, as clearly illustrated in FIG. 5b.

As shown in FIG. 5b, $V_{C2}$ is raising linearly. Again, by referring to the above-mentioned equation (2), $t_{td2}$ can be expressed as:

$$t_{d2} = C2 \frac{V_{th} - 0}{I_b} \quad (4)$$

As mentioned above, the total delay $t_{dtotal}$ generated by the delay generator 200 is obtained by summation of $t_{d1}$ and $t_{d2}$, that is, $t_{d1}+t_{d2}$. From equations (3) and (4), we obtain:

$$t_{dtotal} = \frac{(C1 - C2)V_{th} + C1 \times VDD}{I_b} \quad (5)$$

As C1=C2, it leads to, $$t_{dtotal} = \frac{C1 \times VDD}{I_b} \quad (6)$$

Since C1, VDD and $I_b$ are all preset values, $t_{dtotal}$ will be a constant. In other words, the total delay $t_{dtotal}$ is not affected by the threshold voltage $V_{th}$, which is highly process-sensitive.

Figure 6B:
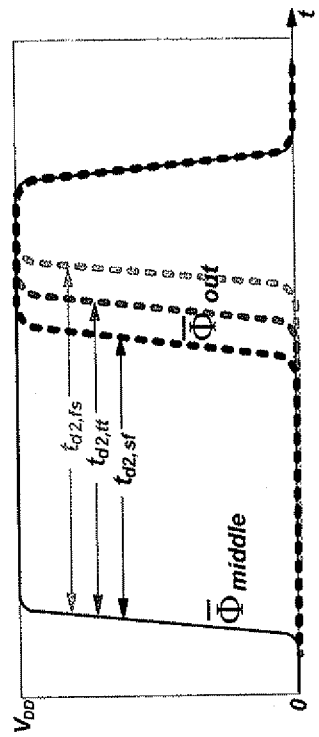
FIGS. 6a and 6b show characteristic waveforms of the delay generator according to the present invention in a typical case and two extreme cases.
Figure 6A:
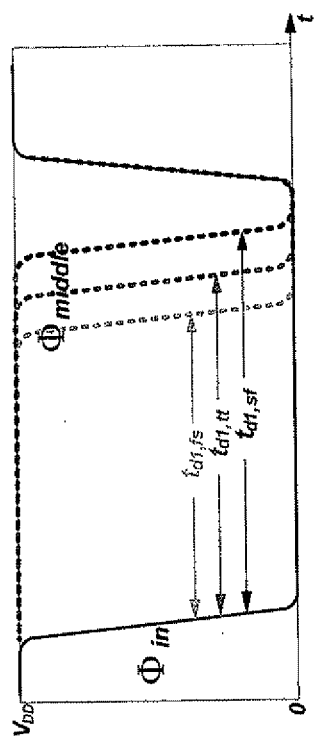

To further explain the threshold voltage compensation applied by the present invention, refer now to FIGS. 6a and 6b, wherein characteristic waveforms of the delay generator according to the present invention are illustrated in a typical case ('tt') and two extreme cases ('fs': fast NMOS and slow PMOS, 'sf': slow NMOS and fast PMOS). The two extreme cases are provided as examples of process corners which will produce most significant drifts in the threshold voltage $V_{th}$. As shown in the figures, waveforms similar to those of FIG. 5a and 5b can be observed for the typical case (process corner 'tt'). For the 'fs' process corner, a shorter $t_{d1,fs}$ and a longer $t_{d2,fs}$ can be observed For the 'sf' process corner, a longer $t_{d1,sf}$ and a shorter $t_{d2,sf}$ can be observed. However, both the summation of $t_{d1,fs}$ and $t_{d2,fs}$ and the summation of $t_{d1,sf}$ and $t_{d2,sf}$ will lead to the same total delay $t_{dtotal}$ as that of the typical process corner 'tt'. In other words, the shorter $t_{d1,fs}$ is "compensated" by the longer $t_{d2,fs}$, and the longer $t_{d1,sf}$ is "compensated" by the shorter $t_{d2,sf}$. This is not difficult to derive because, according to the above equation (6), the same total delay $t_{dtotal}$ will be obtained for either the 'fs' process corner or the 'sf' process corner.

While the present invention has been described with reference to a preferred embodiment, it will be understood by those skilled in the art that various changes may be made and equivalents may be substituted for elements thereof without departing from the scope of the invention. Therefore, it is intended that the invention will include all embodiments falling within the scope of the appended claims.

The invention claimed is:

1. A delay generator, comprising:

a first delay portion comprising at least a plurality of inverters and a first capacitor having a first capacitance; and a second delay portion comprising at least a plurality of inverters and a second capacitor having a second capacitance;

a current source for providing a current to the first delay portion and the second delay portion, wherein the first capacitance is the same as the second capacitance, wherein the first delay portion generates a first delay by discharging of the first capacitor, wherein the second delay portion generates a second delay by charging of the second capacitor, and wherein the total delay generated by the delay generator is obtained by summation of the first delay and the second delay.

2. The delay generator according to claim 1, wherein the total delay is determined by the current and the first capacitance.

3. The delay generator according to claim 1, wherein the first delay portion further comprises two switches that will be turned on by opposite input clocks.

4. The delay generator according to claim 1, wherein the second delay portion further comprises two switches that will be turned on by opposite input clocks.

* * * * *